US007998827B2

United States Patent
Hatano

(10) Patent No.: US 7,998,827 B2
(45) Date of Patent: Aug. 16, 2011

(54) METHOD OF FORMING A MULTI-LEVEL INTERCONNECT STRUCTURE BY OVERLAY ALIGNMENT PROCEDURES

(75) Inventor: Masaaki Hatano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 12/174,780

(22) Filed: Jul. 17, 2008

(65) Prior Publication Data

US 2009/0023266 A1 Jan. 22, 2009

(30) Foreign Application Priority Data

Jul. 20, 2007 (JP) .................................. 2007-189819

(51) Int. Cl.
*H01L 21/76* (2006.01)
(52) U.S. Cl. ........ 438/401; 438/975; 438/123; 438/458; 257/E21.54
(58) Field of Classification Search .................. 438/975, 438/620, 123, 458, 401
See application file for complete search history.

(56) References Cited

U.S. PATENT DOCUMENTS

| 6,087,733 A * | 7/2000 | Maxim et al. ............... 257/797 |
| 6,690,045 B2 * | 2/2004 | Shinkawata ................. 257/258 |
| 7,042,099 B2 | 5/2006 | Kurashima et al. |
| 7,288,848 B2 * | 10/2007 | Lee et al. ..................... 257/797 |
| 2006/0281019 A1 | 12/2006 | Yang |
| 2007/0222960 A1 * | 9/2007 | Van Der Schaar et al. ..... 355/67 |

FOREIGN PATENT DOCUMENTS

JP 2004-79732 3/2004

* cited by examiner

*Primary Examiner* — Thanh V Pham
*Assistant Examiner* — Mark A Laurenzi, III
(74) *Attorney, Agent, or Firm* — Finnegan, Henderson, Farabow, Garrett & Dunner, L.L.P.

(57) ABSTRACT

A method of manufacturing a semiconductor device, includes forming a structure wherein a first alignment mark is provided in a first alignment-mark arrangement area of a first layer, a second alignment mark is provided in a second alignment-mark arrangement area of a second layer, a dummy pattern is provided above the first alignment-mark arrangement area, and substantially no dummy pattern is provided above the second alignment-mark arrangement area, and aligning a third layer provided above the structure by using the second alignment mark.

8 Claims, 9 Drawing Sheets

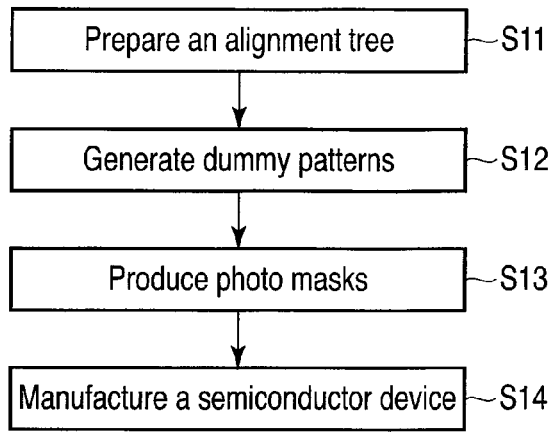
FIG. 1
(Layer La) — (Layer Lb) — (Layer Lc)
— (Layer Ld) — (Layer Le) ....
FIG. 2
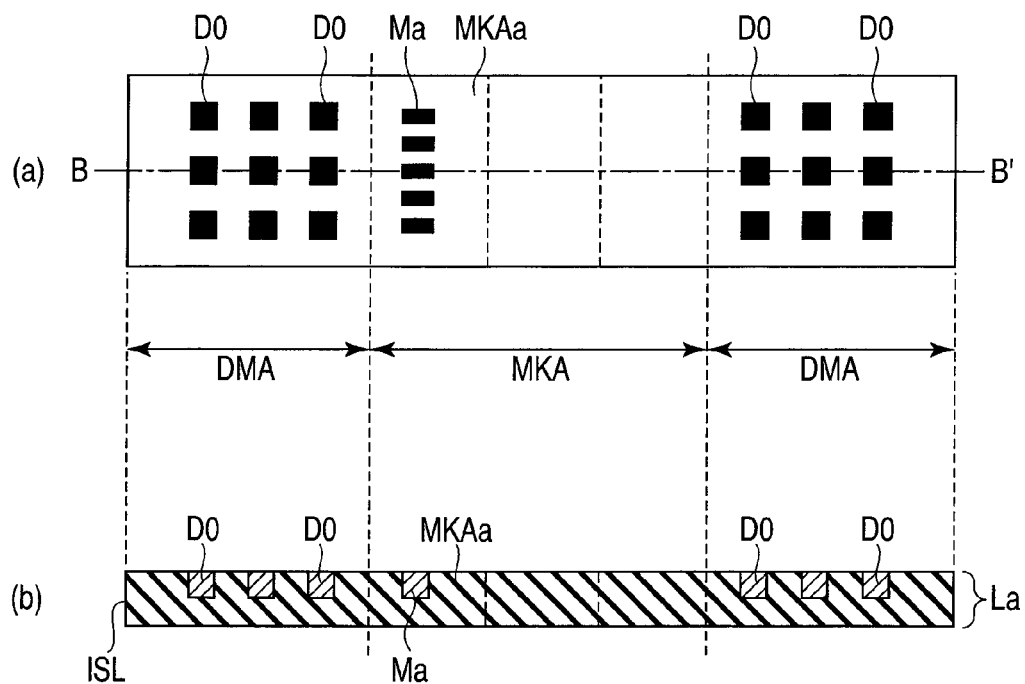
FIG. 3

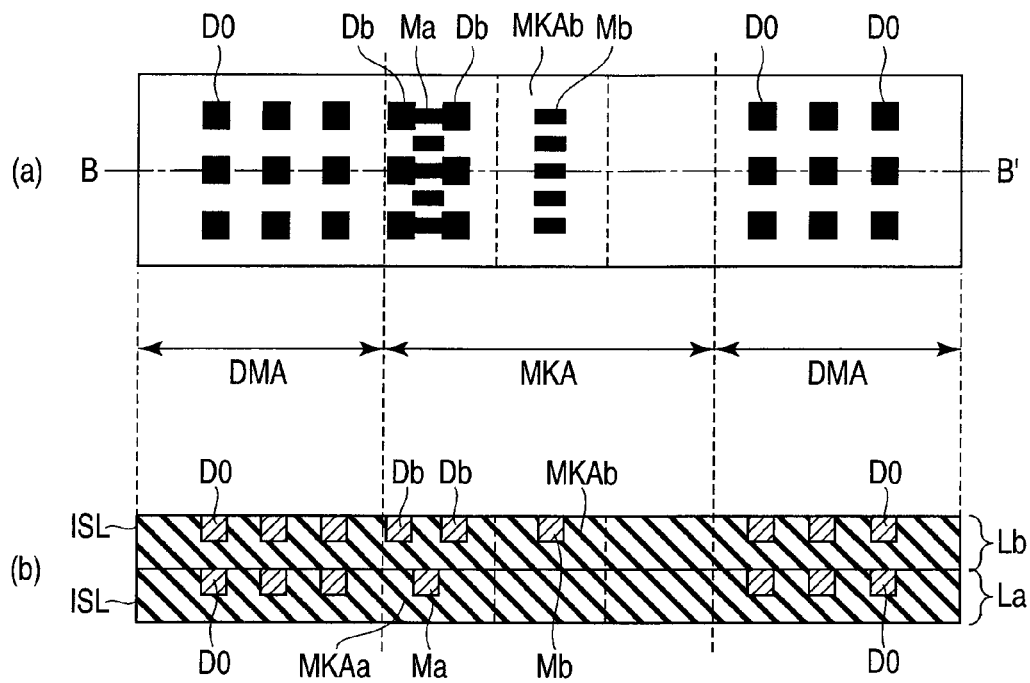
F I G. 4
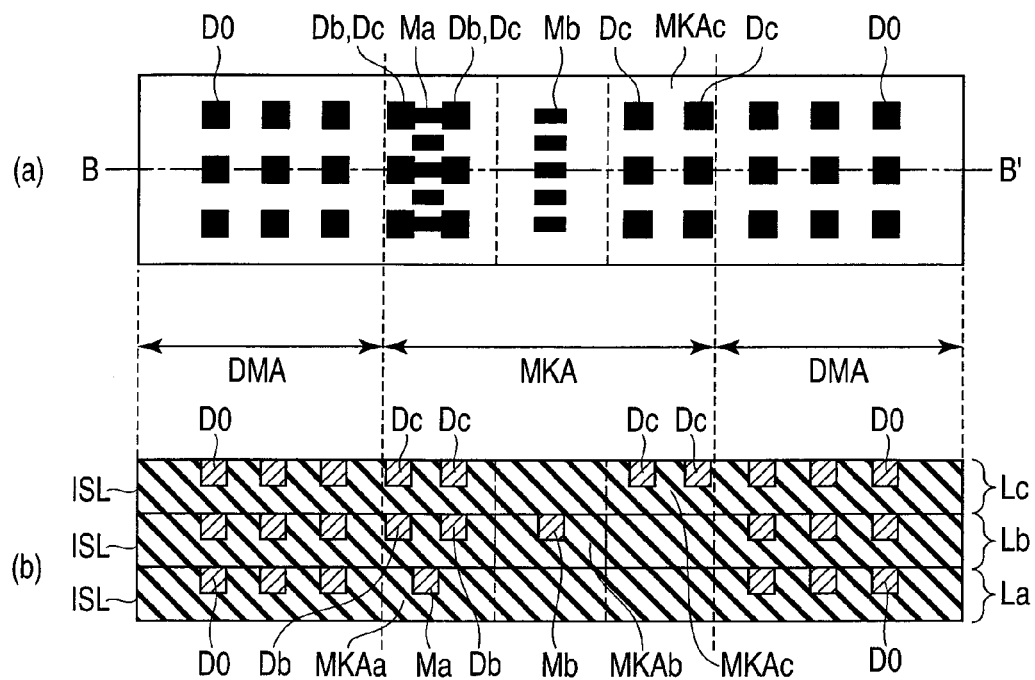
F I G. 5

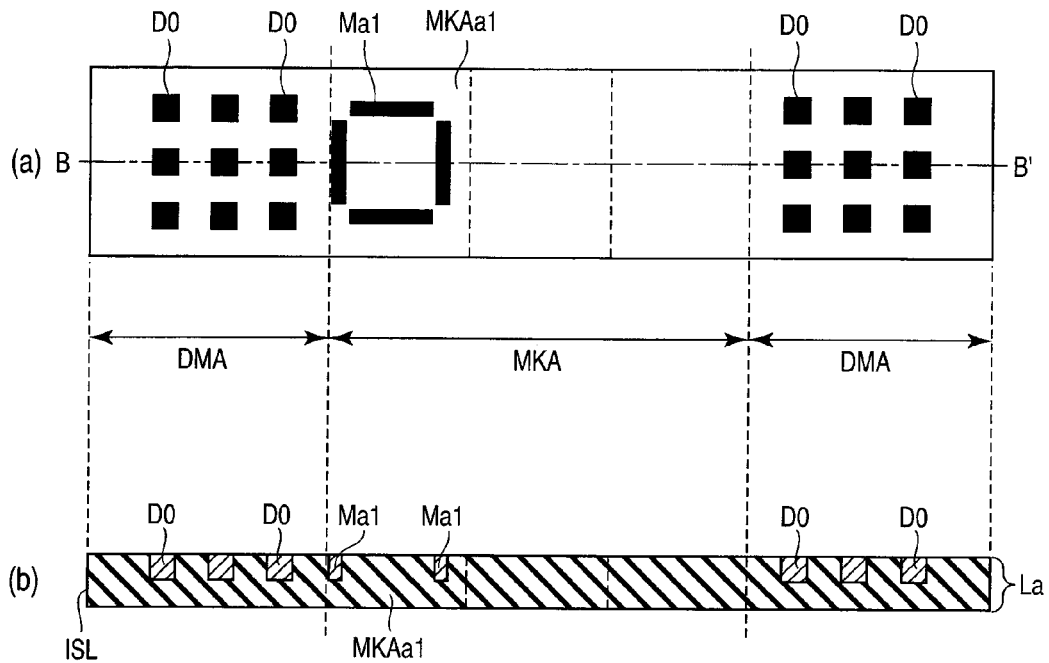
F I G. 8
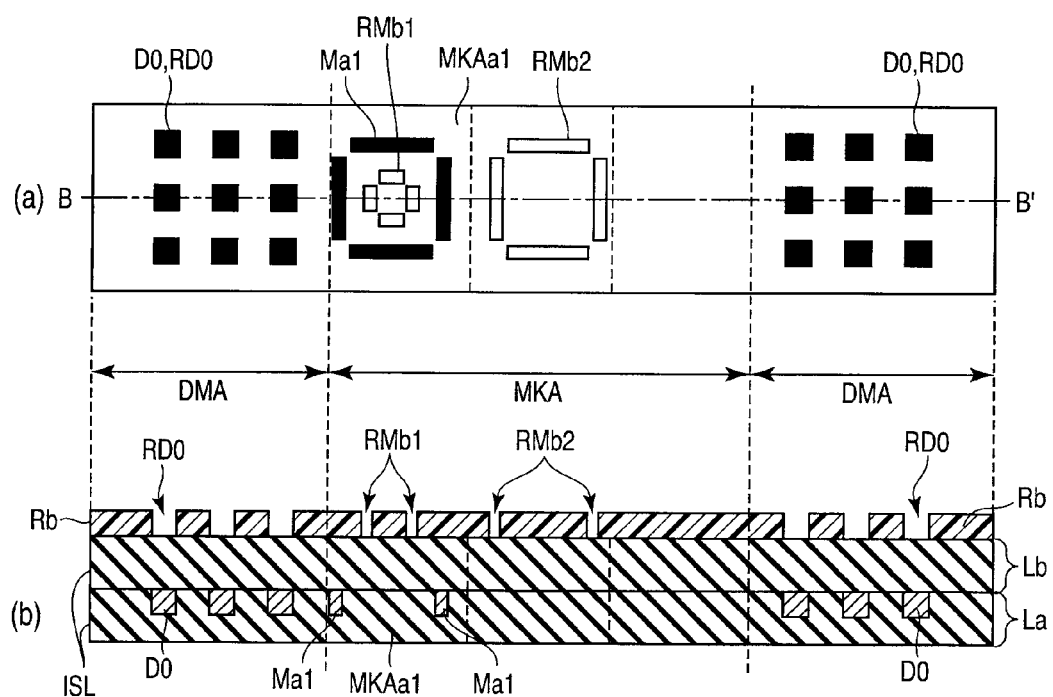
F I G. 9

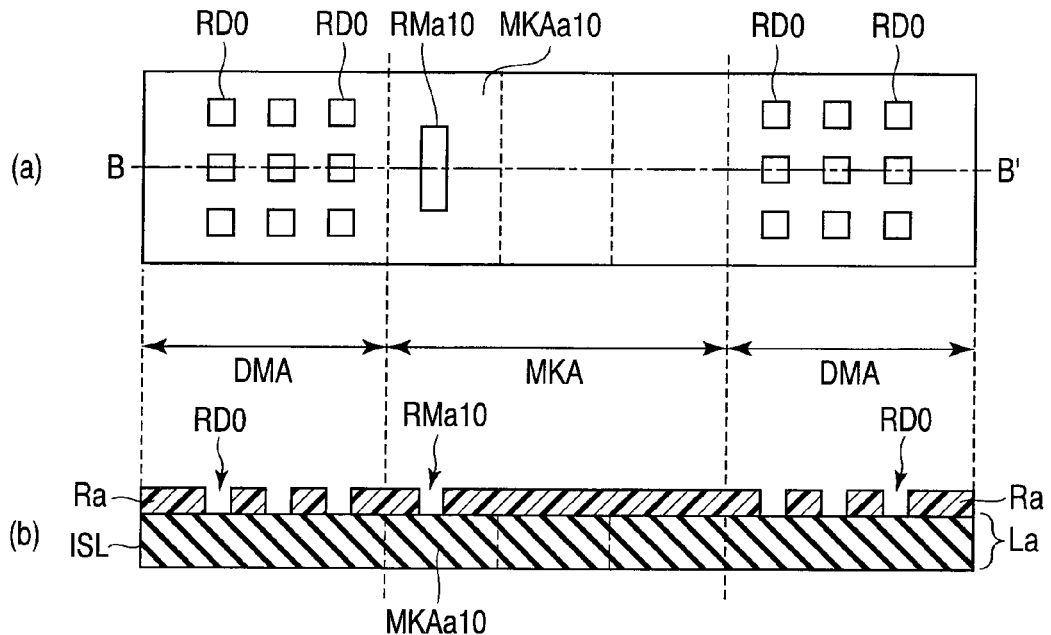
F I G. 16
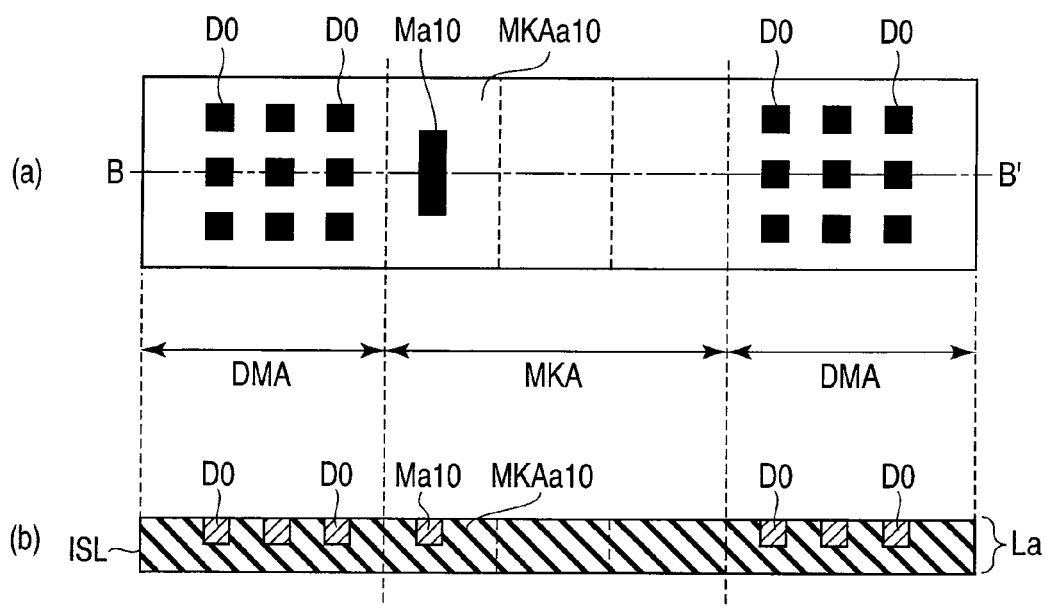
F I G. 17

METHOD OF FORMING A MULTI-LEVEL INTERCONNECT STRUCTURE BY OVERLAY ALIGNMENT PROCEDURES

CROSS-REFERENCE TO RELATED APPLICATIONS

This application is based upon and claims the benefit of priority from prior Japanese Patent Application No. 2007-189819, filed Jul. 20, 2007, the entire contents of which are incorporated herein by reference.

BACKGROUND OF THE INVENTION

1. Field of the Invention

The present invention relates to a method of manufacturing a semiconductor device.

2. Description of the Related Art

To meet a demand for semiconductor integrated circuit devices that can operate at a higher speed, it is proposed that low dielectric constant insulating films should be used as interlayer insulating films. However, low dielectric constant insulating films are liable to peel off. It is therefore suggested that dummy patterns should be provided in any region having no wiring patterns or having wiring patterns formed at low density (see, for example, Jpn. Pat. Apply. KOKAI Publication No. 2004-79732).

However, no dummy patterns are provided in any region in which marks, such as alignment marks, are arranged, in order to securely recognize the mark. Inevitably, films are liable to peel off in the mark arrangement area.

Generally, no dummy patterns have been provided in the mark arrangement area. Hence, various problems, such as film peeling off, may arise.

BRIEF SUMMARY OF THE INVENTION

A first aspect of the present invention, there is provided a method of manufacturing a semiconductor device, comprising: forming a structure wherein a first alignment mark is provided in a first alignment-mark arrangement area of a first layer, a second alignment mark is provided in a second alignment-mark arrangement area of a second layer, a dummy pattern is provided above the first alignment-mark arrangement area, and substantially no dummy pattern is provided above the second alignment-mark arrangement area; and aligning a third layer provided above said structure by using the second alignment mark.

A second aspect of the present invention, there is provided a method of manufacturing a semiconductor device, comprising: forming a structure wherein a pair of first overlay-accuracy measuring marks for measuring an overlay accuracy of patterns is provided in a first overlay-accuracy measuring mark pair arrangement area; and forming a dummy pattern above the first overlay-accuracy measuring mark pair arrangement area.

A third aspect of the present invention, there is provided a method of manufacturing a semiconductor device, comprising: forming a structure wherein a first dimension-accuracy measuring mark for measuring a dimension-accuracy of a pattern is provided in a first dimension-accuracy measuring mark arrangement area; and forming a dummy pattern above the first dimension-accuracy measuring mark arrangement area.

BRIEF DESCRIPTION OF THE SEVERAL VIEWS OF THE DRAWING

FIG. 1 is a flowchart schematically explaining a first embodiment of the present invention;

FIG. 2 is a diagram showing an example of an alignment tree according to the first embodiment of the present invention;

FIGS. 3 to 5 are diagrams schematically explaining a method of manufacturing a semiconductor device according to the first embodiment of the present invention;

FIGS. 8 to 11 are diagrams schematically explaining a method of manufacturing a semiconductor device according to a second embodiment of the present invention;

FIGS. 16 to 18 are diagrams schematically showing a method of manufacturing a semiconductor device according to a third embodiment of the present invention.

DETAILED DESCRIPTION OF THE INVENTION

Figure 6:
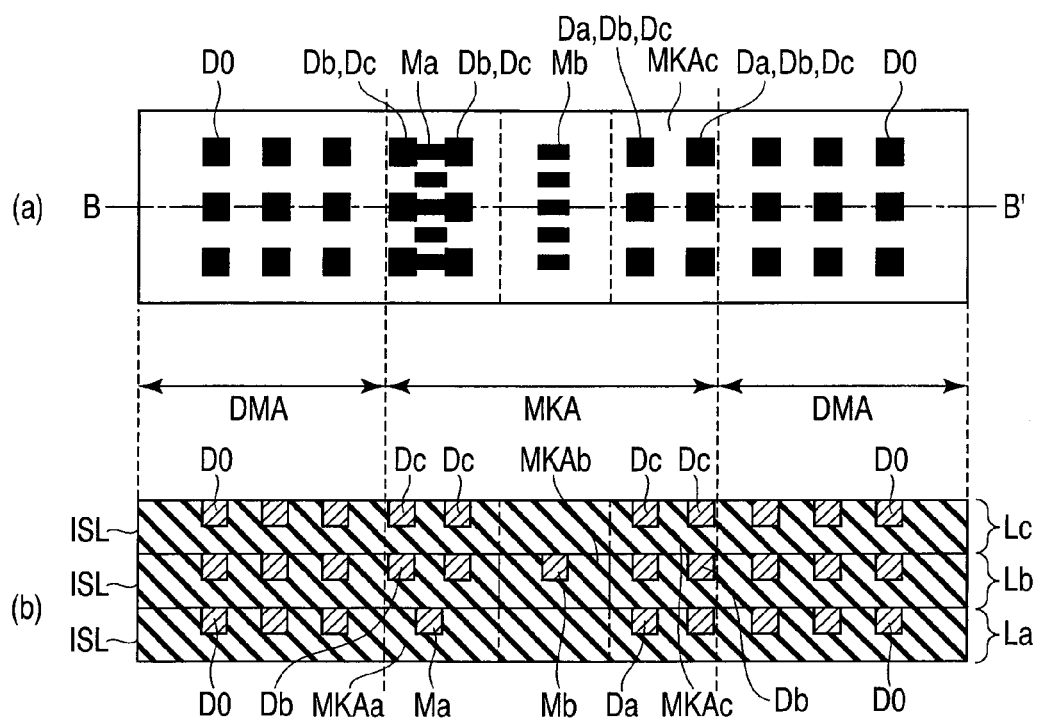
FIG. 6 is a diagram showing a first modification of the first embodiment of the invention.

Embodiments of the present invention will be described with reference to the accompanying drawings.

First Embodiment

FIG. 1 is a flowchart schematically explaining a first embodiment of the present invention.

First, an alignment tree is prepared (S11) before photo masks are produced. FIG. 2 is a diagram showing an example of an alignment tree. In the alignment tree of FIG. 2, a layer Lb is aligned, using an alignment mark of a layer La. Layers Lc and Ld are aligned, using an alignment mark of the layer Lb. Layer Le is aligned, using an alignment mark of the layer Ld.

Then, dummy patterns, which will be arranged in a mark-arrangement area, are generated with reference to the alignment tree (S12). How to generate the dummy patterns will be explained later. Subsequently, photo masks having the dummy patterns generated in step S12 are produced (S13). Further, using the photo masks thus produced, a semiconductor integrated circuit device (semiconductor device) is manufactured (S14).

A method of manufacturing a semiconductor device according to the present embodiment will be explained with reference to FIGS. 3 to 5. FIGS. 3(a) to 5(a) are plan views, each showing a pattern arrangement. FIGS. 3(b) to 5(b) are sectional views taken along lines B-B' shown in FIGS. 3(a) to 5(a), respectively. A process of forming a multi-level interconnect structure will be explained.

First, as shown in FIG. 3, the structure of a layer La is formed on a semiconductor substrate (not shown) on which transistors (not shown) and the like are provided. Another or other layers may be interposed between the semiconductor substrate and the layer La. In the layer La, wires (not shown) are formed by performing a damascene process, in an insulating film ISL such as an interlayer insulating film. In the same step as the wire-forming step, alignment marks Ma and dummy patterns D0 are formed in the insulating film ISL of a scribe-line region (dicing-line region).

The scribe-line region includes a mark arrangement area MKA for arranging an alignment mark and dummy-pattern arrangement areas DMA. The dummy-pattern arrangement areas DMA are regions lying outside the mark arrangement area MKA. Dummy patterns D0 are arranged in each dummy-pattern arrangement area DMA. The dummy patterns D0 can prevent the insulating film ISL from peeling off. The mark arrangement area MKA is a preset region for arranging alignment marks. The mark arrangement area MKA is divided into sub-regions. The alignment marks Ma are arranged in the alignment-mark arrangement area MKAa. That is, the alignment-mark arrangement area MKAa is a preset region for arranging the alignment marks Ma of the layer La.

After the structure of the layer La has been so formed as described above, the structure of the layer Lb is formed on the layer La as shown in FIG. 4. To align the layer Lb, the alignment marks Ma formed in the layer La are used. Wires (not shown) are formed in an insulating film ISL such as an interlayer insulating film in the layer Lb, in the same way as in the layer La. In the same step as this wire-forming step, alignment marks Mb, dummy patterns Db and dummy patterns D0 are formed in an insulating film ISL provided in the scribe-line region.

In the layer Lb, the dummy patterns Db are formed in a mark arrangement area MKA, in addition to the alignment marks Mb. More precisely, the alignment marks Mb are arranged in an alignment-mark arrangement area MKAb (a preset region for arranging the alignment marks Mb of the layer Lb). The dummy patterns Db are arranged in a region that lies on the alignment-mark arrangement area MKAa.

As can be seen from the alignment tree shown in FIG. 2, the alignment marks Ma are used, exclusively for the alignment of the layer Lb. Thus, once the layer Lb has been aligned, the alignment marks Ma are no longer used in any alignment process. Hence, no problems will arise in the alignment process if dummy patterns Db are formed above the alignment-mark arrangement area MKAa in which the alignment marks Ma are arranged. This is why the dummy patterns Db are arranged above the alignment-mark arrangement area MKAa in the present embodiment, preventing the insulating film ISL from peeling off.

After the structure of the layer Lb has been so formed as described above, the structure of the layer Lc is formed on the layer Lb as shown in FIG. 5. To align the layer Lc, the alignment marks Mb formed in the layer Lb are used. Wires (not shown) are formed in an insulating film ISL such as an interlayer insulating film in the layer Lc, in the same way as in the layer La. In the same step as the wire-forming step, dummy patterns Dc and dummy patterns D0 are formed in an insulating film ISL provided in the scribe-line region.

In the layer Lc, no alignment marks are arranged in the mark arrangement area MKA. Only dummy patterns Dc are arranged in the mark arrangement area MKA. As can be understood from the alignment tree shown in FIG. 2, the layer Lc is not used to align any other layer. Therefore, no alignment marks are arranged in the alignment-mark arrangement area MKAc (i.e., preset area used as an alignment mark arrangement area for layer Lc, if alignment marks are arranged in the layer Lc). Instead, dummy patterns Dc are arranged in the alignment-mark arrangement area MKAc. As pointed out above, no problems will arise in the alignment process if dummy patterns are formed above the alignment-mark arrangement area MKAa in which the alignment marks Ma are arranged. This is why dummy patterns Dc are arranged above the alignment mark arrangement area MKAa. Thus, the dummy patterns Dc can prevent the insulating film from peeling off.

After the structure of the layer Lc has been so formed as described above, the structures of the layer Ld and the like are formed, and the semiconductor device (semiconductor integrated circuit device) is formed. As is evident from the alignment tree shown in FIG. 2, the alignment marks Mb formed in the layer Lb are used to align the layer Ld. The alignment marks Mb are not used to align the following layers. Therefore, dummy patterns are formed also in a region of the layer Ld, which is located above the alignment-mark arrangement area MKAb.

In the present embodiment, as described above, the alignment marks Ma (first alignment marks) are provided in the alignment-mark arrangement area MKAa (first alignment-mark arrangement area) of the layer La (first layer), and the alignment marks Mb (second alignment marks) are provided in the alignment-mark arrangement area MKAb (second alignment-mark arrangement area) of the layer Lb (second layer). Further, the dummy patterns Db are provided above the alignment-mark arrangement area MKAa, and no dummy patterns are provided above the alignment-mark arrangement area MKAb.

Therefore, the dummy patterns Db can prevent the insulating film ISL from peeling off, and the layer Lc (third layer) can be aligned by using the alignment marks Mb. Since alignment marks Ma are not used after the layer Lb has been aligned, the dummy patterns Db formed above the alignment-mark arrangement area MKAa will not hinder the alignment. Thus, in the present embodiment, dummy patterns can be effectively arranged in the mark arrangement area without hindering the alignment, and the dummy patterns so arranged can prevent the insulating film from peeling off.

In the embodiment described above, the dummy patterns Db are formed, only in the area right above the alignment-mark arrangement area MKAa in, for example, the manufacturing step of FIG. 4. Nonetheless, part of the dummy patterns Db may be formed outside the area right above the alignment-mark arrangement area MKAa, if the stepper can well recognize patterns, without interfering the alignment marks Mb. Even if part of the dummy patterns Dc is formed outside the area right above the alignment-mark arrangement area MKAa, substantially no dummy patterns are considered to be formed above the alignment-mark arrangement area MKAb, provided that the dummy patterns do not interfere with the alignment marks Mb. No problems will arise, for example, when the layer Ld is aligned by using the alignment marks Mb.

FIG. 6 is a diagram showing the first modification of the first embodiment described above. More precisely, FIG. 6(a) is a plan view of patterns, and FIG. 6(b) is a sectional view taken along line B-B' shown in FIG. 6(a).

As has been described, the layer Lc is not used to align any other layer (see the alignment tree shown in FIG. 2). Therefore, in the above embodiment, the dummy patterns Dc are arranged, instead of alignment marks, in the alignment-mark arrangement area MKAc (third alignment-mark arrangement area) as illustrated in FIG. 5. In this modification, the dummy patterns Dc are arranged in the alignment-mark arrangement area MKAc, and the dummy patterns Db and Da are arranged in the areas that lie below the alignment-mark arrangement area MKAc. In this configuration, more dummy patterns can be provided in each layer.

Figure 7:
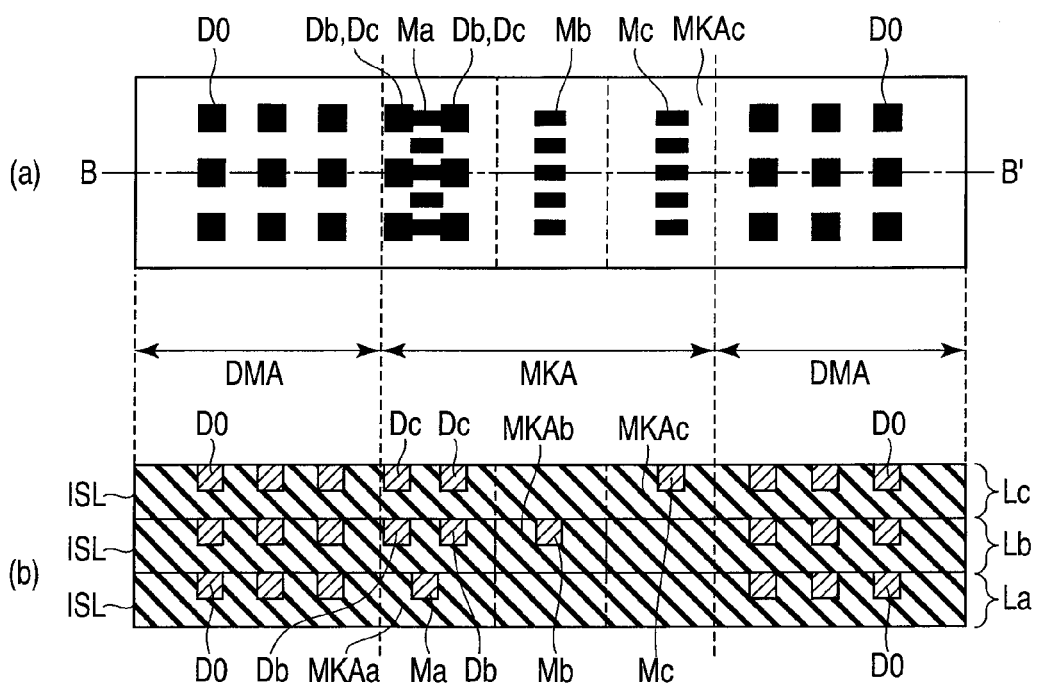
FIG. 7 is a diagram showing a second modification of the first embodiment of the invention.

FIG. 7 is a diagram showing a second modification of the first embodiment. More precisely, FIG. 7(a) is a plan view of patterns, and FIG. 7(b) is a sectional view taken along line B-B' shown in FIG. 7(a).

As has been described, the layer Lc is not used to align any other layer (see the alignment tree shown in FIG. 2). Therefore, in the embodiment described above, no alignment marks are arranged in the alignment-mark arrangement area MKAc, as illustrated in FIG. 5. However, for some reason the stepper may fail to well recognize the alignment marks Mb arranged in the layer Lb. In view of this, spare alignment marks Mc are arranged in the alignment-mark arrangement area MKAc in the second modification. Hence, even if the stepper cannot well recognize the alignment marks Mb, the alignment can be reliably accomplished by using the spare alignment marks Mc.

As can be understood from the above, dummy patterns are arranged, basically in accordance with the following concept in the present embodiment. Dummy patterns are formed above any region having alignment marks that will not be used in subsequent alignment, and no dummy patterns are formed above any region having alignment marks that will be used in subsequent alignment. This concept is applied to the method of manufacturing the semiconductor device according to the first embodiment, and dummy patterns are formed in the mark arrangement area MKA based on the concept. That is, dummy patterns are generated based on this concept in the process of designing photo masks, and the photo masks having the dummy patterns are produced, and the semiconductor device is manufactured by using the photo masks (see FIG. 1).

The embodiment described above is concerned with a process (i.e., back-end (BEOL) process) of forming a multi-level interconnect structure of a semiconductor integrated circuit device. The method explained above can be employed in a front-end (FEOL) process and a contact-plug process.

Second Embodiment

This embodiment relates to a method of arranging a dummy pattern in a mark arrangement area for overlay-accuracy measuring marks. The overlay-accuracy measuring marks are marks that are used to measure the pattern overlay accuracy (or pattern overlay error).

The present embodiment can be outlined by the flowchart of FIG. 1, too. That is, an alignment tree (FIG. 2) is prepared (S11) before a photo mask is produced. Then, dummy patterns to be arranged in a mark arrangement area are generated with reference to the alignment tree (S12). Further, photo masks having the dummy patterns generated in Step S12 are produced (S13). Further, using the photo masks thus produced, a semiconductor integrated circuit device (semiconductor device) is manufactured (S14).

A method of manufacturing the semiconductor device according to this embodiment will be explained with reference to FIGS. 8 to 11. FIGS. 8(a) to 11(a) are plan views, each showing a pattern. FIGS. 8(b) to 11(b) are sectional views taken along lines B-B' shown in FIGS. 8(a) to 11(a), respectively. Here, a process of forming a multi-level interconnect structure will be explained. The components identical to those of the first embodiment are designated by the same reference symbols and will not be described in detail. The respective layers of the semiconductor device are aligned by using alignment marks (e.g., such alignment marks as described in conjunction with the first embodiment) that are provided in areas other than those illustrated in FIGS. 8 to 11. Nonetheless, the alignment marks will not be described.

First, as shown in FIG. 8, the structure of a layer La is formed on a semiconductor substrate (not shown) on which transistors (not shown) and the like are provided. Another or other layers may be interposed between the semiconductor substrate and the layer La. In the layer La, wires (not shown) are formed by performing a damascene process, in an insulating film ISL such as an interlayer insulating film. In the same step as the wire-forming step, overlay-accuracy measuring marks Ma1 and dummy patterns D0 are formed in the insulating film ISL of a scribe-line region (dicing-line region).

The scribe-line region includes a mark arrangement area MKA and dummy-pattern arrangement areas DMA. The dummy-pattern arrangement areas DMA are regions lying outside the mark arrangement area MKA. Dummy patterns D0 are arranged in each dummy-pattern arrangement area DMA. The dummy patterns D0 can prevent the insulating film ISL from peeling off. The mark arrangement area MKA is a preset region for arranging overlay-accuracy measuring marks. The mark arrangement area MKA is divided into sub-regions. The overlay-accuracy measuring marks Ma1 are arranged in an overlay-accuracy measuring mark arrangement area MKAa1. That is, the overlay-accuracy measuring mark arrangement area MKAa1 is a preset region for arranging the overlay-accuracy measuring marks Ma1 of layer La.

After the structure of the layer La has been formed, an insulating film (interlayer insulating film) ISL for layer Lb is formed on the layer La as shown in FIG. 9. Further, a photoresist pattern Rb is formed on the insulating film ISL by ordinary photolithography, in order to form a wiring trench pattern in a region (not shown) of the insulating film ISL. At this point, opening patterns RMb1 and RMb2 for the overlay-accuracy measuring marks, and opening patterns RD0 for dummy patterns are formed in the photoresist pattern Rb in the scribe line region.

As can be seen from the alignment tree shown in FIG. 2, the layer Lb is aligned by using the alignment marks provided in the layer La. In order to measure the overlay accuracy of the layer Lb with respect to the layer La, the opening patterns RMb1 for the overlay-accuracy measuring marks are provided in the photoresist pattern Rb laid on the layer Lb, in addition to the overlay-accuracy measuring marks Ma1 provided in the layer La.

After the structure shown in FIG. 9 has been formed, the alignment error of the opening patterns RMb1 with respect to the marks Ma1 is detected, thereby measuring the overlay accuracy of the layer Lb with respect to the layer La. If the overlay accuracy does not satisfy a preset criteria (that is, if the overlay error is greater than a preset value), the photoresist pattern Rb is removed, and a new photoresist pattern Rb is formed. That is, a reworking process is performed on the photoresist pattern Rb. If the overlay accuracy satisfies the preset criteria (that is, if the overlay error is smaller than the preset value), the process goes to the step illustrated in FIG. 10, after confirming that the dimension accuracy of the pattern meets the preset criteria, which will be described in a third embodiment.

Figure 10:
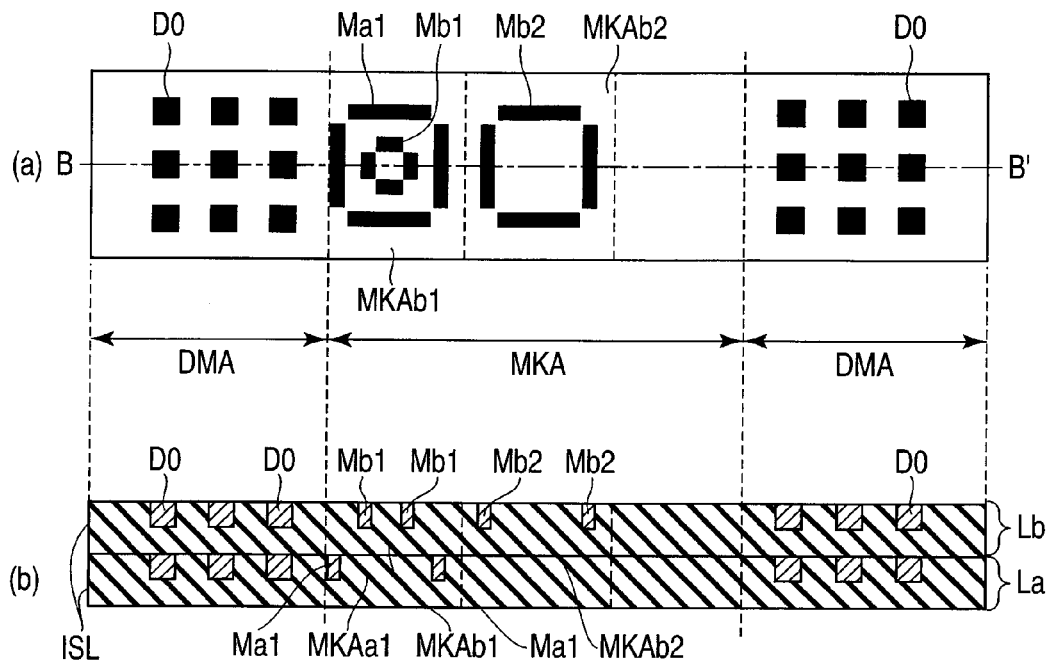

In the step of FIG. 10, the insulating film ISL for the layer Lb is patterned, using the photoresist pattern Rb shown in FIG. 9 as a mask. A trench pattern (or hole pattern) is thereby formed in the insulating film ISL, in conformity with the opening pattern of the photoresist pattern Rb. Then, the trenches (or holes) are filled with conductive material. As a result, wires (not shown) are formed in the insulating film ISL. At the same time the wires are thus formed, overlay-accuracy measuring marks Mb1, overlay-accuracy measuring marks Mb2, and dummy patterns D0 are formed in the insulating film ISL which lies in the scribe-line region. The overlay-accuracy measuring marks Mb1 are formed in an overlay-accuracy measuring mark arrangement area MKAb1 already determined. The overlay-accuracy measuring marks Mb2 are formed in an overlay-accuracy measuring mark arrangement area MKAb2 already determined.

Figure 11:
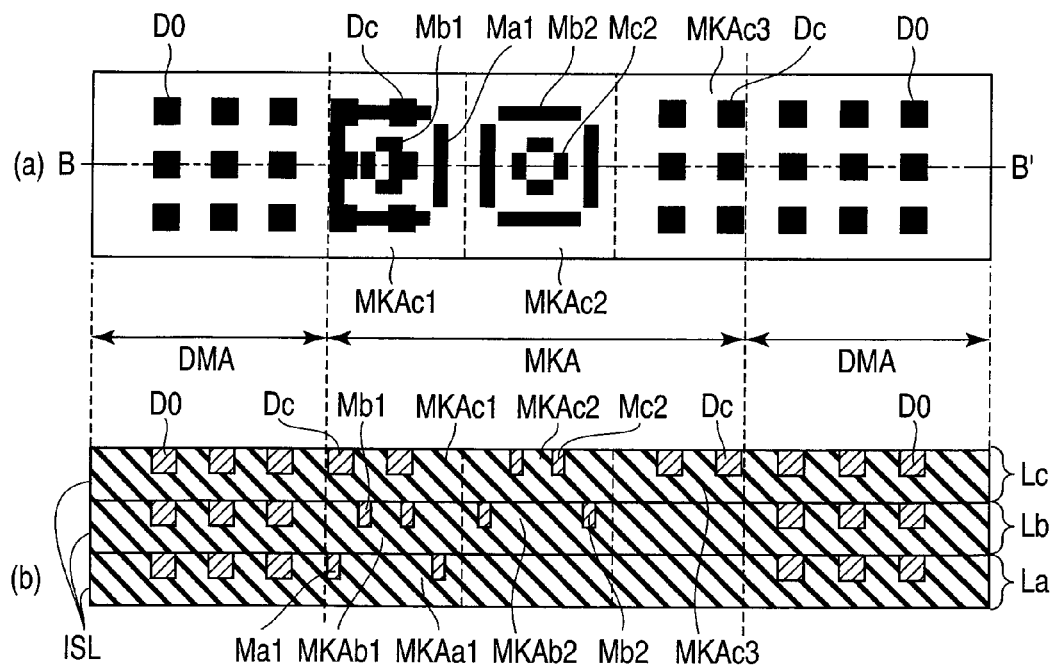

After the structure of the layer Lb has been formed, the structure of the layer Lc is formed on the layer Lb as illustrated in FIG. 11. The basic method of forming the structure of the layer Lc is similar to the method of forming the structure of the layer Lb. That is, the insulating film ISL (interlayer insulating film) for the layer Lc is formed on the layer Lb, and a photoresist pattern (not shown) is formed on the insulating film ISL. Subsequently, the overlay accuracy is measured in the same way as for the layer Lb. Moreover, a reworking process is performed, if necessary, on the photoresist pattern. After the dimension accuracy of the pattern is found to satisfy the preset criteria, the photoresist pattern, which satisfies the preset overlay accuracy (which satisfies the preset criteria), is used as a mask, patterning the insulating film ISL. Trenches (or holes) are thereby made in the insulating film ISL, in conformity with the openings of the photoresist pattern. The trenches (or holes) are filled with conductive material. Wires (not shown) are thereby formed in the insulating film ISL. At the same time the wires are thus formed, overlay-accuracy measuring marks Mc2, dummy patterns Dc and dummy patterns D0 are formed in the insulating film ISL which lies in the scribe-line region.

The overlay-accuracy measuring marks Mc2 are arranged in an overlay-accuracy measuring mark arrangement area MKAc2 already determined. As seen from the alignment tree shown in FIG. 2, the layer Lc is aligned by using the alignment marks provided in the layer Lb. In order to measure the overlay accuracy of the layer Lc with respect to the layer Lb, the overlay-accuracy measuring marks Mb2 are provided in the layer Lb, and the overlay-accuracy measuring marks Mc2 are provided in the layer Lc. The overlay accuracy of the layer Lc with respect to the layer Lb can be measured by detecting the error of the opening pattern of the photoresist for forming the marks Mc2 with respect to the marks Mb2.

Dummy patterns Dc are formed above the region in which a pair of overlay-accuracy measuring marks Ma1 and Mb1 is arranged, that is, above the region in which overlay-accuracy measuring mark arrangement areas MKAa1 and MKAb1 are arranged. As mentioned above, the pair of overlay-accuracy measuring marks Ma1 and Mb1 is provided to measure the overlay accuracy of the layers La and Lb. The overlay-accuracy measuring marks Ma1 and Mb1 are no longer necessary once the overlay accuracy of the layers La and Lb has been measured. Hence, the dummy patterns Dc are provided in the area MKAc1 on the area in which the pair of overlay-accuracy measuring marks Ma1 and Mb1 are arranged, thereby to prevent the insulating film from peeling off.

As seen from the alignment tree shown in FIG. 2, the layer Lc is not used to align any other layer. Therefore, no overlay-accuracy measuring marks are arranged in an overlay-accuracy measuring mark arrangement area MKAc3. Instead, the dummy patterns Dc are arranged in the overlay-accuracy measuring mark arrangement area MKAc3.

After the structure of the layer Lc shown in FIG. 11 has been formed, the structure of the layer Ld is formed. A semiconductor device (semiconductor integrated circuit device) is thus manufactured.

In the embodiment described above, the overlay-accuracy measuring mark pair (for example, a pair of marks Ma1 and Mb1) is arranged in the adjacent layers (for example, layers La and Lb). Nonetheless, the overlay-accuracy measuring mark pair may not be arranged in adjacent layers. In the alignment tree of FIG. 2, for example, the layer Ld is aligned, by using the alignment marks provided in the layer Lb. In this case, the overlay-accuracy measuring mark pair is provided in the layers Lb and Ld, and dummy patterns are formed above the overlay-accuracy measuring mark arrangement area of the layer Ld.

As described above, in the present embodiment, the dummy patterns Dc are formed above the area (first overlay-accuracy measuring mark pair arrangement area) in which a pair of overlay-accuracy measuring marks (first overlay-accuracy measuring marks) Ma1 and Mb1 is arranged. Therefore, the dummy patterns Dc can prevent the insulating film ISL from peeling off. The overlay-accuracy measuring marks Ma1 and Mb1 are no longer necessary once the overlay accuracy has been measured. Hence, the dummy patterns Dc do not hinder the overlay-accuracy measuring, if they are formed above the area in which the overlay-accuracy measuring marks Ma1 and Mb1 are arranged. Thus, the dummy patterns can be effectively arranged in the mark arrangement area, not hindering the measuring of overlay accuracy. Hence, the insulating film is prevented from peeling off in the present embodiment.

In the embodiment described above, the dummy patterns Dc arranged above the overlay-accuracy measuring mark arrangement areas MKAa1 and MKAb1 are formed in only the area that lies right above the overlay-accuracy measuring mark arrangement areas MKAa1 and MKAb1. Nevertheless, part of the dummy patterns Dc may be formed in an area not right above the overlay-accuracy measuring mark arrangement areas MKAa1 and MKAb1 if they do not interfere with the overlay-accuracy measuring marks Mb2 and Mc2.

Figure 12:
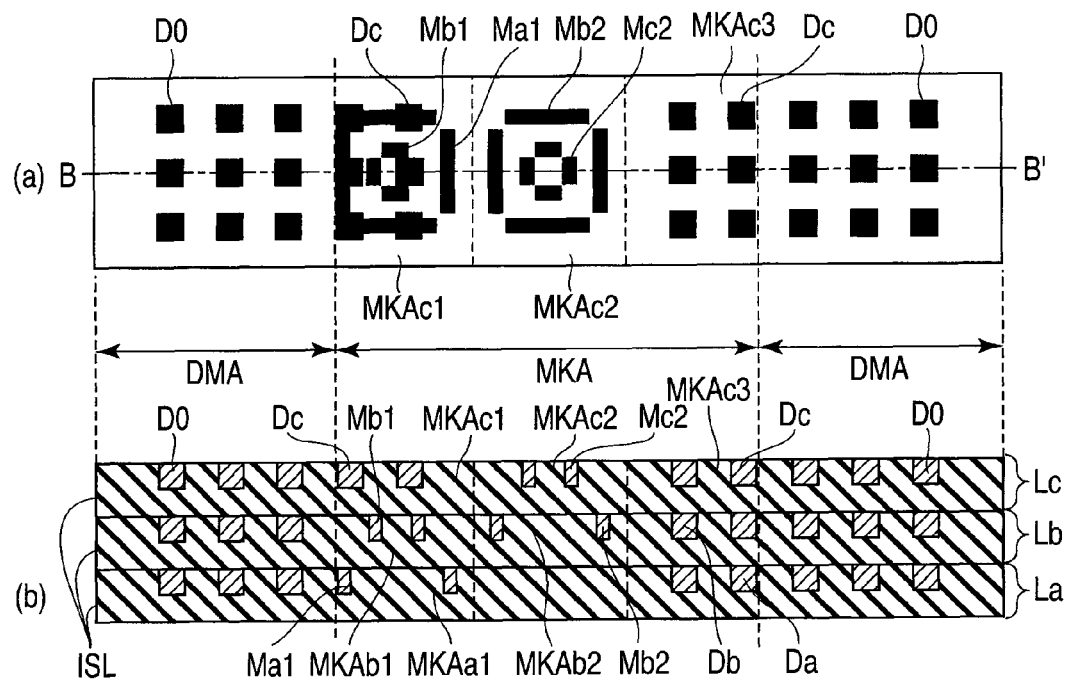
FIG. 12 is a diagram showing a first modification of the second embodiment of the invention.

FIG. 12 is a diagram showing a first modification of the present embodiment. More precisely, FIG. 12(a) is a plan view of patterns, and FIG. 12(b) is a sectional view taken along line B-B' shown in FIG. 12(a).

As already pointed out, the layer Lc is not used to align any other layer. Therefore, as shown in FIG. 11, the dummy patterns Dc are arranged, instead of overlay-accuracy measuring marks, in the overlay-accuracy measuring mark arrangement area MKAc3 in the embodiment described above. In this modification, dummy patterns Dc are arranged in the overlay-accuracy measuring mark arrangement area MKAc3, and dummy patterns Da and Db are arranged in the area below the overlay-accuracy measuring mark arrangement area MKAc3. Using this structure, more dummy patterns can be formed in each layer.

Figure 13:
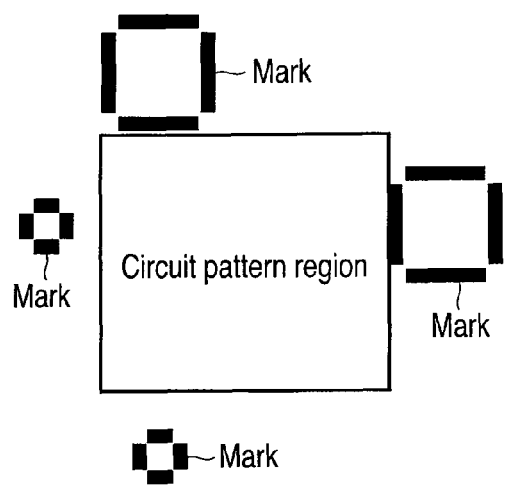
FIG. 13 is a diagram schematically showing one of one-shot areas according to a second modification of the second embodiment of the invention.
Figure 14:
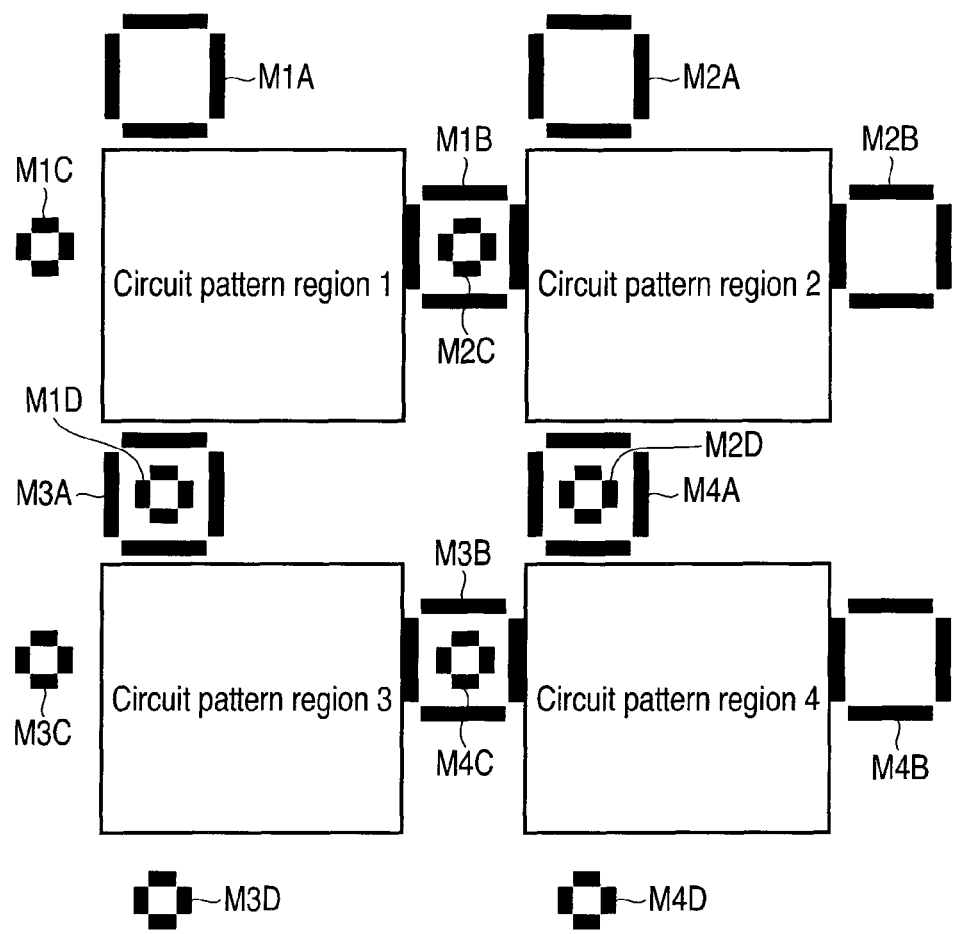
FIG. 14 is a plan view showing the second modification of the second embodiment of the present invention.
Figure 15:
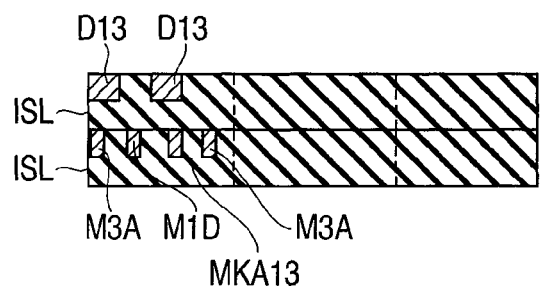
FIG. 15 is a sectional view showing the second modification of the second embodiment of the present invention.

FIGS. 13 to 15 are diagrams showing a second modification of the second embodiment. In the embodiment described above, the overlay-accuracy measuring marks of each mark pair are arranged in different layers. In the second modification, the overlay-accuracy measuring marks of each mark pair are arranged in the same layer.

As is known in the art, pattern transfer is performed several times for the same layer in the lithography using a stepper. In recent years, semiconductor integrated circuit devices are getting smaller, and the tolerance for the inter-layer overlay error is proportionally decreasing. The overlay error between an upper layer and a lower layer can be reduced by decreasing the overlay error between the shots existing in the same lower layer. In view of this, the overlay accuracy between the shots is important. This is why the overlay-accuracy measuring marks of each mark pair are formed in the same layer in the second modification. Further, dummy patterns are formed above the region in which the pair of overlay-accuracy measuring marks is arranged as in the embodiment described above. The second modification will be described below in detail.

FIG. 13 is a diagram schematically showing one of one-shot areas, each being an area to which a circuit pattern and overlay-accuracy measuring marks are transferred by one shot. As shown in FIG. 13, four overlay-accuracy measuring marks are arranged around a circuit pattern region, in order to measure the overlay accuracy (overlay error) between the circuit pattern region and the four circuit pattern regions (not shown) that surround the circuit pattern region.

FIG. 14 is a plan view schematically showing four adjacent one-shot areas. When the first shot is performed, a circuit pattern of the circuit pattern region 1 and overlay-accuracy measuring marks M1A, M1B, M1C and M1D are formed. When the second shot is performed, a circuit pattern of the circuit pattern region 2 and overlay-accuracy measuring marks M2A, M2B, M2C and M2D are formed. When the third shot is performed, a circuit pattern of the circuit pattern region 3 and overlay-accuracy measuring marks M3A, M3B, M3C and M3D are formed. When the fourth shot is performed, a circuit pattern of the circuit pattern region 4 and overlay-accuracy measuring marks M4A, M4B, M4C and M4D are formed.

More specifically, latent-image patterns are formed in a photoresist formed on an insulating film, such as an interlayer insulating film, as the first to fourth shots are performed. Then, the latent-image patterns are developed, forming photoresist patterns. Thus, a photoresist pattern is formed, which has opening patterns for the circuit pattern regions and opening patterns for the overlay-accuracy measuring marks. Next, using the opening patterns for the overlay-accuracy measuring marks, the overlay accuracy between the shots is measured. The overlay accuracy (or error) between, for example, the opening pattern for the mark M1B and the opening pattern for the mark M2C is measured, thereby finding the overlay accuracy (or error) between the first and second shots. Similarly, the overlay accuracy (or error) between, for example, the opening pattern for the mark M1D and the opening pattern for the mark M3A is measured, thereby finding the overlay accuracy (or error) between the first and third shots. If the overlay accuracy does not satisfy a preset criteria (that is, if the overlay error is greater than a preset value), a reworking process is performed on the photoresist pattern as in the embodiment described above. If the overlay accuracy satisfies the preset criteria (that is, if the overlay error is smaller than the preset value), after confirming that the dimension accuracy of the pattern meets a preset criteria, an etching process is performed on the insulating film by using a photoresist pattern as a mask. An opening pattern is thereby formed in the insulating film in conformity with the photoresist pattern. The opening pattern is filled with conductive material. As a result, a wiring pattern is formed and overlay-accuracy measuring marks are formed.

In the next layer immediately above the layer so formed as described above, dummy patterns are arranged above the overlay-accuracy measuring mark-pair arrangement area, as is illustrated in FIG. 15. That is, as FIG. 15 shows, dummy patterns D13 are formed above an overlay-accuracy measuring mark-pair arrangement area MKA13 in which a pair of marks M1D and M3A shown in FIG. 14 is provided. As has been described, the pair of overlay-accuracy measuring marks is no longer necessary once the overlay accuracy has been measured. Hence, the dummy patterns D13, which are formed above the overlay-accuracy measuring mark-pair arrangement area MKA13 as shown in FIG. 15, do not hinder the overlay-accuracy measuring.

In the second modification, dummy patterns are formed above the area in which the pair of overlay-accuracy measuring marks is arranged, as in the embodiment described above. The second modification can therefore achieve the same advantages as the embodiment described above.

As has been explained, in the present embodiment, dummy patterns are formed above the area in which the pair of overlay-accuracy measuring marks is arranged. In other words, dummy patterns are generated based on this concept in the process of designing photo masks, the photo masks having the dummy patterns are produced, and the semiconductor device is manufactured by using the photo masks.

Third Embodiment

This embodiment is a method of arranging dummy patterns in a mark arrangement area for dimension-accuracy measuring marks. The dimension-accuracy measuring marks are marks that are used to measure the dimension accuracy of patterns. As representative example of a dimension-accuracy measuring mark is a dose/focus meter. Dose and focus are important parameters that determine the exposure conditions. If the dose and focus change, the patterns will change in dimension. Hence, whether the dose and focus are appropriate or not can be determined by measuring the dimension of the dose/focus meter (dimension accuracy measuring mark) formed on the wafer.

The present embodiment can be outlined by steps S12 to S14 shown in the flowchart of FIG. 1. That is, dummy patterns to be arranged in the mark arrangement area are generated (S12). Then, photo masks having the dummy patterns are produced (S13). Further, using the photo masks thus produced, a semiconductor integrated circuit device (semiconductor device) is manufactured (S14).

Figure 18:
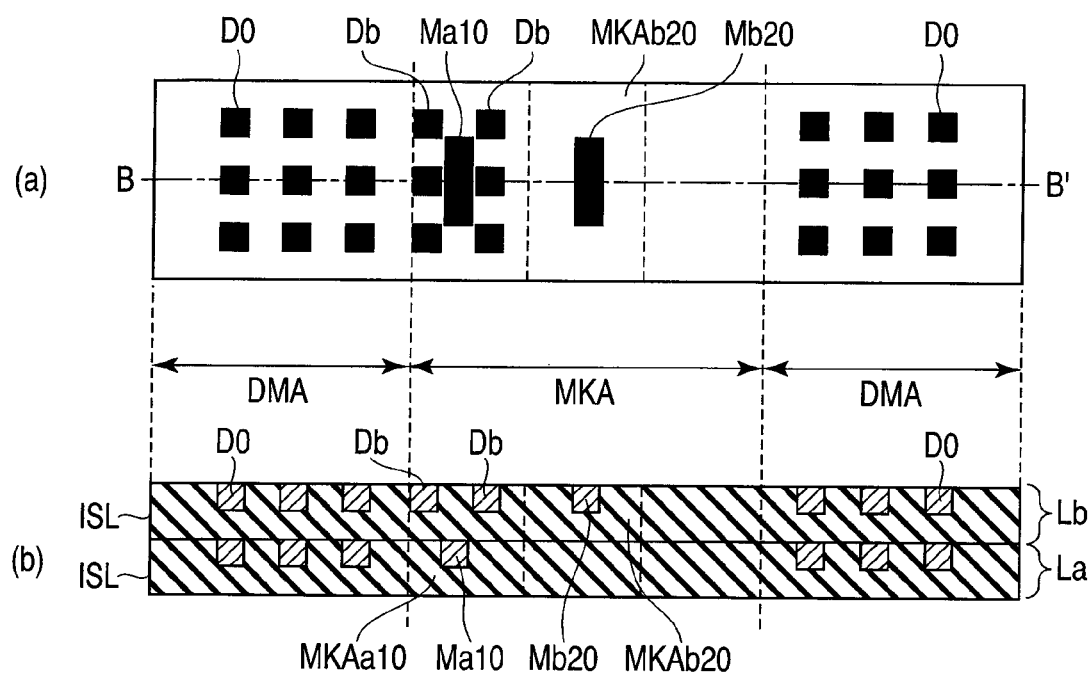

A method of manufacturing a semiconductor device according to the present embodiment will be explained with reference to FIGS. 16 to 18. FIGS. 16(a) to 18(a) are plan views, each showing a pattern. FIGS. 16(b) to 18(b) are sectional views taken along lines B-B' shown in FIGS. 16(a) to 18(a), respectively. A process of forming a multi-level interconnect structure will be explained. The components identical to those of the first embodiment are designated by the same reference symbols and will not be described in detail. The respective layers are aligned by using alignment marks (e.g., such alignment marks as described in the first embodiment) that are provided in areas other than those illustrated in FIGS. 16 to 18. Nonetheless, the alignment marks will not be described.

First, as shown in FIG. 16, an insulating film ISL (interlayer insulating film) for a layer La is formed on a semiconductor substrate (not shown) on which transistors (not shown) and the like are provided. Another or other layers may be interposed between the semiconductor substrate and the insulating film ISL for the layer La. Further, a photoresist pattern Ra is formed on the insulating film ISL by ordinary photolithography, in order to form a wiring trench pattern in a region (not shown) of the insulating film ISL. At this point, an opening pattern RMa10 for a dimension-accuracy measuring mark and opening patterns RD0 for dummy patterns are formed in the photoresist pattern Ra in the scribe line region.

As shown in FIG. 16, a scribe-line region includes a mark arrangement area MKA and dummy-pattern arrangement areas DMA. The dummy-pattern arrangement areas DMA are regions lying outside the mark arrangement area MKA. Dummy patterns are formed in the dummy pattern arrangement area DMA. The mark arrangement area MKA is a preset region for forming dimension-accuracy measuring marks. The mark arrangement area MKA is divided into sub-regions. The opening pattern RMa10 for a dimension-accuracy measuring mark is formed on a dimension-accuracy measuring mark arrangement area MKAa10.

After the structure shown in FIG. 16 has been so formed as described above, the dimension of the opening pattern RMa10 for a dimension-accuracy measuring mark is measured. In other words, it is determined whether the dose and focus are appropriate. If the dimension accuracy does not satisfy a preset criteria (that is, if the dimension error is greater than a preset value), the photoresist pattern Ra is removed, and a new photoresist pattern Ra is formed. That is, a reworking process is performed on the photoresist pattern Ra. In the reworking process, the dimension of the opening pattern RMa10, which has been measured, is reflected. To be more specific, the dose or the focus, or both are adjusted and the exposure is performed, in such a way that the dimension of the photoresist pattern Ra is close to the preset value. If the dimension accuracy satisfies the preset criteria (that is, if the dimension error is smaller than the preset value), the process goes to the step illustrated in FIG. 17.

In the step of FIG. 17, the insulating film ISL for the layer La is patterned, using the photoresist pattern Ra shown in FIG. 16 as a mask. A trench pattern (or hole pattern) is thereby formed in the insulating film ISL, in conformity with the opening pattern of the photoresist pattern Ra. Then, the trenches (or holes) are filled with conductive material. As a result, wires (not shown) are formed in the insulating film ISL. At the same time the wires are thus formed, a dimension-accuracy measuring mark Ma10 and dummy patterns D0 are formed in the insulating film ISL, which lies in the scribe-line region. The dimension-accuracy measuring mark Ma10 is formed in a dimension-accuracy measuring mark arrangement area MKAa10 already determined. The dummy patterns D0 are formed in dummy-pattern arrangement areas DMA. The dummy patterns D0 can prevent the insulating film ISL from peeling off.

Next, as shown in FIG. 18, a structure of the layer Lb is formed on the layer La. The basic method of forming the structure of the layer Lb is similar to the method of forming the structure of the layer La. That is, an insulating film ISL (interlayer insulating film) for the layer Lb is formed on the layer La. Then, a photoresist pattern (not shown) is formed on the insulating film ISL. The dimension accuracy is measured in the same way as in the case of the layer La. Moreover, a reworking process is performed, if necessary, on the photoresist pattern. Then, the photoresist pattern which satisfies the preset dimension accuracy (i.e., preset criteria) is used as a mask, patterning the insulating film ISL for the layer Lb. Trenches (or holes) are thereby made in the insulating film ISL, in conformity with the openings of the photoresist pattern. The trenches (or holes) are filled with conductive material. Wires (not shown) are thereby formed in the insulating film ISL. At the same time the wires are thus formed, a dimension-accuracy measuring mark Mb20, dummy patterns Db and dummy patterns D0 are formed in the insulating film ISL, which lies in the scribe-line region. The dimension-accuracy measuring mark Mb20 is formed in a dimension-accuracy measuring mark arrangement area MKAb20 already determined, the dummy patterns Db are formed above the dimension-accuracy measuring mark arrangement area MKAa10. Since the dimension-accuracy measuring mark Ma10 formed in the layer La has already been used to measure the dimension accuracy, no problems will arise if dummy patterns Db are formed above the dimension-accuracy measuring mark arrangement area MKAa10. This is why the dummy patterns Db are provided, preventing the insulating film ISL from peeling off.

After the structure of the layer Lb shown in FIG. 18 has been formed, the structure of the layer Lc is formed. A semiconductor device (semiconductor integrated circuit device) is thus manufactured.

As described above, in the present embodiment, the dummy patterns Db are formed above the dimension-accuracy measuring mark arrangement area MKAa10 (first dimension-accuracy measuring mark arrangement area) in which the dimension-accuracy measuring mark Ma10 (first dimension-accuracy measuring mark) is arranged. The dummy patterns Db can therefore prevent the insulating film ISL from peeling off. Moreover, the dummy patterns Db do not hinder the measuring though the dummy patterns Db are formed above the dimension-accuracy measuring mark arrangement area MKAa10, because the dimension-accuracy measuring mark Ma10 is no longer necessary once the dimension accuracy has been measured. Thus, in this embodiment, dummy patterns can be effectively arranged in the mark arrangement area, not to hinder the dimension accuracy measuring, and can prevent the insulating film from peeling off.

As has been explained, in the present embodiment, dummy patterns are formed above the area in which the dimension-accuracy measuring mark is arranged. In other words, dummy patterns are generated based on this concept in the process of designing photo masks, the photo masks having the dummy patterns are produced, and the semiconductor device is manufactured by using the photo masks.

In the embodiment described above, the dummy patterns Db are formed in, for example, the step of FIG. 18 in only the area that lies right above the dimension-accuracy measuring mark arrangement area MKAa10. Nevertheless, part of the dummy patterns Db may be formed in an area not right above the dimension-accuracy measuring mark arrangement area MKAa10 if they do not interfere with the dimension-accuracy measuring mark Mb20.

In each of the embodiments described above, the dummy patterns are rectangular. Nonetheless, the dummy patterns may have any other shape. Moreover, the alignment marks, the overlay-accuracy measuring marks, and the dimension-accuracy measuring marks are not limited, in terms of shape, to those described in the above embodiments. They may have various shapes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a structure wherein a first alignment mark is provided in a first alignment-mark arrangement area of a first layer, a second alignment mark is provided in a second alignment-mark arrangement area of a second layer, a first dummy pattern is provided above the first alignment-mark arrangement area, and substantially no dummy pattern is provided above the second alignment-mark arrangement area; and aligning a third layer provided above the structure by using the second alignment mark, wherein the first dummy pattern provided above the first alignment-mark arrangement area is provided in the second layer and is formed in the same step as the second alignment mark, and wherein a second dummy pattern is provided in a first part of the third layer, and substantially no dummy pattern is provided in a second part of the third layer, the first part being located above the first alignment-mark arrangement area and the second part being located above the second alignment-mark arrangement area.

2. The method according to claim 1, wherein the first alignment mark is not used to align any layer that is located higher than the second layer.

3. The method according to claim 1, wherein a third dummy pattern is formed in a third alignment-mark arrangement area of the third layer, when the third layer is not used to align any layer that is located higher than the third layer.

4. The method according to claim 3, wherein a fourth dummy pattern is provided below the third alignment-mark arrangement area.

5. The method according to claim 1, wherein a spare alignment mark is formed in a third alignment-mark arrangement area of the third layer, when the third layer is not used to align any layer that is located higher than the third layer.

6. The method according to claim 1, wherein providing the first dummy pattern above the first alignment-mark arrangement area is determined on the basis of whether or not the first alignment mark is used for alignment of a layer located higher than the first layer.

7. The method according to claim 1, wherein the first alignment mark, the second alignment mark, and the first dummy pattern provided above the first alignment-mark arrangement area are provided in a scribe-line region.

8. The method according to claim 1, wherein the first dummy pattern provided above the first alignment-mark arrangement area is formed in an insulating film.

* * * * *